(12) United States Patent
Södergren et al.

(10) Patent No.: US 9,043,074 B2
(45) Date of Patent: May 26, 2015

(54) DETERMINATION OF RUNNING RESISTANCE FOR A VEHICLE

(75) Inventors: Maria Södergren, Segeltorp (SE); Martin Evaldsson, Nacka (SE)

(73) Assignee: Scania CV AB (SE)

( * ) Notice: Subject to any disclaimer, the term of this patent is extended or adjusted under 35 U.S.C. 154(b) by 0 days.

(21) Appl. No.: 14/126,041

(22) PCT Filed: Jun. 15, 2012

(86) PCT No.: PCT/SE2012/050652
§ 371 (c)(1),
(2), (4) Date: Dec. 13, 2013

(87) PCT Pub. No.: WO2013/006118
PCT Pub. Date: Jan. 10, 2013

(65) Prior Publication Data
US 2014/0121889 A1 May 1, 2014

(30) Foreign Application Priority Data

Jun. 27, 2011 (SE) ...................................... 1150593

(51) Int. Cl.
*B60T 8/172* (2006.01)
*B60W 30/00* (2006.01)
(Continued)

(52) U.S. Cl.
CPC .......... *G06F 17/5009* (2013.01); *B60W 30/143* (2013.01); *B60W 40/1005* (2013.01);
(Continued)

(58) Field of Classification Search
CPC ... B60W 40/00; B60W 40/06; B60W 40/064; B60W 40/068; B60W 40/076; B60W 40/10; B60W 40/1005; B60W 2550/14; B60W 2550/142; B60W 2550/143; B60W 30/18172; B60W 30/18109; B60W 30/18118; B60W 30/00; B60T 7/00; B60T 7/04; B60T 7/12; B60T 8/172; F16D 59/00
USPC .............................. 701/32.9, 30.2, 70; 703/2
See application file for complete search history.

(56) References Cited

U.S. PATENT DOCUMENTS

| 6,192,307 B1 * | 2/2001 | Okamoto et al. ................ 701/70 |
| 2007/0198136 A1 * | 8/2007 | Kobayashi et al. ................ 701/1 |

(Continued)

FOREIGN PATENT DOCUMENTS

| DE | 31 24 428 A1 | 1/1983 |
| DE | 102 29 036 A1 | 1/2004 |

OTHER PUBLICATIONS

International Search Report dated Nov. 28, 2012 issued in corresponding International Patent Application No. PCT/SE2012/050652.
International Preliminary Report on Patentability dated May 31, 2013 issued in corresponding International Patent Application No. PCT/SE2012/050652.

*Primary Examiner* — Yonel Beaulieu
(74) *Attorney, Agent, or Firm* — Ostrolenk Faber LLP

(57) ABSTRACT

A method and a system for determining a running resistance $F_{res}$ for a vehicle. A model-based running resistance $F_{res,mod}$ is estimated. Thereafter an energy change difference $\Delta W_{diff}$ between a model-based estimated energy change $\Delta W_{pred}$ and an actual energy change $\Delta W_{real}$ is determined for the vehicle from a starting point to an end point of a distance S which is traveled by the vehicle. A braking force $F_{unknown}$ which is unknown to the model and which acts upon the vehicle over the distance S is also determined on the basis of the energy change difference $\Delta W_{diff}$. Thereafter the running resistance $F_{res}$ is determined to an adjusted value of the model-based estimate of the running resistance $F_{res,mod}$, the adjustment being based on the braking force $F_{unknown}$ which is unknown to the model.

19 Claims, 4 Drawing Sheets

(51) Int. Cl.
  *G06F 17/50* (2006.01)
  *B60W 40/10* (2012.01)
  *G01M 17/007* (2006.01)
  *B60W 30/14* (2006.01)
  *B60W 50/00* (2006.01)
(52) U.S. Cl.
  CPC ........ *B60W50/0097* (2013.01); *B60W 2520/10* (2013.01); *B60W 2550/143* (2013.01); *B60W 2550/402* (2013.01); *G01M 17/007* (2013.01)

(56) References Cited

U.S. PATENT DOCUMENTS

| | | | | |
|---|---|---|---|---|
| 2010/0100278 | A1* | 4/2010 | Saito | 701/34 |
| 2010/0138123 | A1* | 6/2010 | Tokimasa et al. | 701/70 |
| 2012/0316744 | A1* | 12/2012 | Shimura et al. | 701/72 |
| 2013/0211686 | A1* | 8/2013 | Shono et al. | 701/70 |

* cited by examiner

DETERMINATION OF RUNNING RESISTANCE FOR A VEHICLE

CROSS-REFERENCE TO RELATED APPLICATIONS

The present application is a 35 U.S.C. §§371 national phase conversion of PCT/SE2012/050652, filed Jun. 15, 2012, which claims priority of Swedish Application No. 1150593-0, filed Jun. 27, 2011, the contents of which are incorporated by reference herein. The PCT International Application was published in the English language.

TECHNICAL FIELD

The present invention relates to a method for determining a running resistance $F_{res}$ for a vehicle a system for determining a running resistance $F_{res}$ for a vehicle, and a vehicle with the system that performs the method. The present invention relates also to a computer program and a computer program product which implement the method according to the invention.

BACKGROUND

Figure 1:
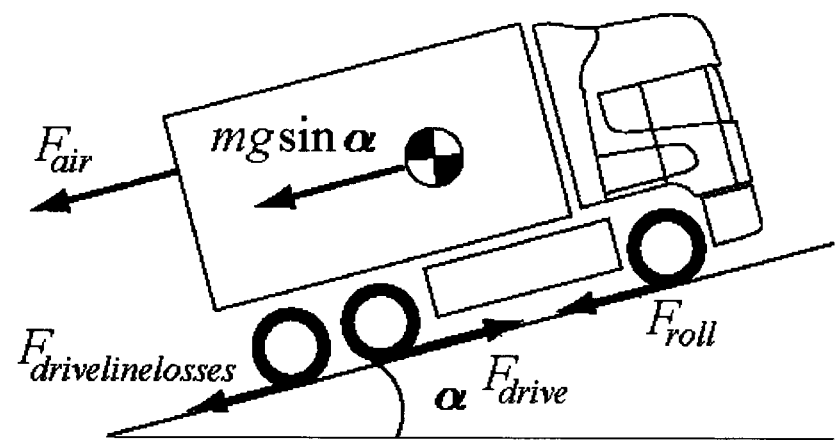

A vehicle is acted upon by a variety of forces schematically illustrated in FIG. 1. An equation describing these forces may be written as $$m\dot{v}=F_{drive}-F_{res}-mg\sin\alpha=F_{drive}-F_{drivelinelosses}-F_{roll}-F_{air}-mg\sin\alpha \quad (eq. 1)$$

in which
- $m\dot{v}$ is the vehicle's weight m multiplied by the vehicle's acceleration $\dot{v}$ to represent the total amount of forces acting upon the vehicle,
- $F_{drive}$ is the driving force propelling the vehicle, provided mainly by the engine system,
- $F_{res}=F_{drivelinelosses}+F_{roll}+F_{air}$ is the running resistance for the vehicle,
- $F_{drivelinelosses}$ is power losses in the power train, e.g. losses in the clutch, transmission and other components of the power train, and the engine system's drag losses depending on the engine system's drag torque,
- $F_{roll}$ is the rolling resistance for the vehicle,
- $F_{air}$ is the air resistance for the vehicle, and
- $mg\sin\alpha$ is the force of gravity acting upon the vehicle at a road gradient $\alpha$.

The running resistance $F_{res}$ is employed in many applications in a vehicle. For example, decisions by cruise controls and automatic gearchange systems are based inter alia on the magnitude of the running resistance. It is therefore very important to be able to estimate the running resistance correctly and efficiently.

Today's economical cruise controls take account inter alia of running resistance $F_{res}$. Traditional cruise controls maintain a constant reference speed $v_{ref}$ which corresponds to the speed $v_{set}$ chosen by the driver. The value of the reference speed $v_{ref}$ is only altered when the driver adjusts the set speed $v_{set}$ while driving. Certain economical cruise controls, e.g. Ecocruise cruise controls, have knowledge of the historical running resistance $F_{res,hist}$ and try also to estimate a current running resistance $F_{res,pres}$.

An experienced driver of a vehicle without cruise control can reduce fuel consumption by adapting his/her driving to the characteristics of the road ahead so that unnecessary braking and/or fuel-consuming acceleration can be avoided. A further development of the aforesaid economical cruise controls tries to mimic the experienced driver's adaptive driving on the basis of knowledge of the road ahead so that fuel consumption can be kept as low as possible, since this very greatly affects profitability for an owner of the vehicle, e.g. a haulage company or the like.

An example of such a further development of an economical cruise control is a "look ahead" cruise control (LACC), i.e. an intelligent cruise control which uses knowledge of road sections ahead, i.e. knowledge of the characteristics of the road ahead, to determine the configuration of the reference speed $v_{ref}$. Here the reference speed $v_{ref}$ is therefore allowed, within a certain speed range, to differ from the set speed $v_{set}$ chosen by the driver, in order to run the vehicle in a way which saves more fuel.

Knowledge of the road section ahead may for example comprise prevailing topography, road curvature and state of the road on the section ahead. This knowledge may for example be obtained from location information, e.g. GPS (global positioning system) information, map data and/or topographical map data, and weather reports. With an intelligent cruise control which takes account of the topography ahead, i.e. a look-ahead cruise control, it is therefore possible to optimise the vehicle's reference speed $v_{ref}$ for different kinds of road, performance and train weight in order to achieve fuel saving.

An economical cruise control can, inter alia on the basis of the forces which act upon the vehicle, i.e. on the basis of the force equation (eq. 1), predict for example the vehicle's speed along a horizon of any suitable length, e.g. 1-2 km. The vehicle's future speed along the horizon may be predicted in various ways, e.g. by assuming that it will run with traditional cruise control with a reference speed $v_{ref}$ which is the same as the set speed $v_{set}$, or by assuming that the reference speed $v_{ref}$ is allowed to vary relative to the set speed $v_{set}$.

A look-ahead cruise control (LACC) does for example allow the reference speed $v_{ref}$ to be raised, before an upgrade, to above the set speed $v_{set}$, since the vehicle will presumably lose speed on the upgrade owing to high train weight relative to engine performance. Similarly, the LACC allows the reference speed $v_{ref}$ to drop to below the set speed $v_{set}$ before a downgrade on which the vehicle will presumably be accelerated by its train weight. The concept here is that it is better from a fuel economy perspective to take advantage of the vehicle's acceleration by its own weight downhill than to initially accelerate before the downgrade and then brake on the downgrade. The LACC can thus reduce fuel consumption without greatly affecting journey time. Being able to determine the reference speed $v_{ref}$ so that these fuel savings can be achieved depends on good knowledge of the vehicle's force equation (eq. 1), i.e. good knowledge of the forces which act upon the vehicle. The running resistance $F_{res}$ is one of these forces.

There are also cruise controls which use a running resistance $F_{res}$ as a basis for deciding how the vehicle's speed should vary. This means that such cruise controls can allow the reference speed $v_{ref}$ to deviate from the set speed $v_{set}$ on the basis of at least one characteristic of the running resistance, e.g. its magnitude over time.

According to prior art described in DE102006029366, the running resistance $F_{res}$ is estimated continually on the basis of the vehicle's acceleration. Such estimation may involve problems, as described in more detail below.

BRIEF DESCRIPTION OF THE INVENTION

It is important for systems which employ the running resistance $F_{res}$ in their calculations to have available a correct value for the running resistance $F_{res}$. If these systems have access to only unreliable or incorrect values for the running resistance $F_{res}$, this may lead to dangerously and/or uneconomically wrong decisions due to these deficient or unavailable values for the running resistance $F_{res}$.

As mentioned above, certain prior art solutions estimate the running resistance $F_{res}$ continuously on the basis of the vehicle's acceleration. Such estimation needs to be based on knowledge of road gradient α and vehicle weight m. But such knowledge is most commonly itself based on estimates which inevitably entail further uncertainties. The prior art methods thus often result in an estimate of the running resistance $F_{res}$ which is impaired by errors, potentially leading to wrong decisions by systems which employ this incorrect estimate.

An object of the present invention is to propose a more efficient and more correct determination of the running resistance $F_{res}$ which reduces the risk of wrong decisions in a vehicle.

This object is achieved by the aforesaid method for determining a running resistance $F_{res}$ for a vehicle, according to the invention. It is also achieved by a system for determining a running resistance $F_{res}$ for a vehicle according to the invention, by a vehicle according to the invention, and by the aforesaid computer program and computer program product.

The present invention makes it possible for simple and computationally efficient models for the vehicle's driving force $F_{drive}$, rolling resistance $F_{roll}$ and air resistance $F_{air}$ for the vehicle to be employed in determining the running resistance $F_{res}$. These simple models also require only a limited amount of storage space to be able to conduct the modelling as compared with more complicated models.

The present invention determines the running resistance on the basis of a change in the vehicle's energy $\Delta W_{diff}$ over a distance S. The result is an average value, i.e. an extracted filtered value, for the difference in the change in energy $\Delta W_{diff}$. This average value may also be regarded as a physically averaged value when the effect of the forces over a distance/time is employed instead of momentary forces acting upon the vehicle, thus employing an averaged value for the effect of the forces. In other words, the average value of the energy change difference $\Delta W_{diff}$ is based on a non-momentary value for the forces. Basing the calculations on an energy change over a distance instead of on the basis, as in prior art methods, of momentary values of, for example, an acceleration signal, means that fewer calculations need be done and that the values arrived at are of high quality since they take account of variations over the whole distance S. This average value will for example be less sensitive to gusty winds.

Various embodiments of the present invention make advantageous choices of when and/or where to determine the vehicle's running resistance. These choices of time and/or place for such determination result in fewer and simpler calculations for determining the running resistance.

According to an embodiment of the invention, the determination of the energy change difference $\Delta W_{diff}$ may with advantage be done when the running resistance $F_{res}$ is considerably greater than the driving force e.g. when $F_{drive}$ is substantially zero (0) N. The determination thus takes place here when the engine is dragged and is contributing substantially no propulsive force. The calculations are thus simplified.

According to an embodiment of the invention, the determination of the energy change difference $\Delta W_{diff}$ may with advantage be done when the running resistance $F_{res}$ dominates the force equation, i.e. when $F_{res}$ constitutes a large proportion of the forces in the force equation (eq. 1) for the vehicle. The calculations are thus likewise simplified. If for example the driving force $F_{drive}$ is zero (0) N and the respective road segment is level, the running resistance $F_{res}$ accounts for 100% of the forces in the righthand member of the force equation (eq. 1).

According to an embodiment of the present invention, the determination of the energy change difference $\Delta W_{diff}$ may with advantage be done when the vehicle effects a speed change, e.g. a retardation. This reduces the impact of any uncertainty about whether an estimate of the vehicle's weight m corresponds to its actual weight.

According to an embodiment of the present invention, the determination of the energy change difference $\Delta W_{diff}$ should be done when the road section covered by the distance S is substantially level at least in places, i.e. when the section S comprises one or more substantially level portions. This likewise reduces also the influence of the vehicle's weight m on the determination of the running resistance $F_{res}$.

An example of an occasion which according to the present invention is very appropriate for determining the running resistance $F_{res}$ is just before a downgrade. The road gradient α is generally slight at the approach to a downgrade. Economical cruise controls which take account of road sections ahead usually effect also a retardation just before a downgrade. On such occasions there are therefore no unknown driving forces acting upon the vehicle and the impact of uncertainty about the vehicle's weight m is also minimised. The result may be a very reliable and simple estimate of the running resistance $F_{res}$.

Access to the running resistance determined correctly by the present invention makes it possible for systems which employ the running resistance in their calculations, e.g. economical cruise controls which take account of road segments ahead, to make well-founded and correct decisions. This means that the vehicle's total fuel consumption can be reduced if this is prioritised. Similarly it is also possible to achieve, for example, a more powerful vehicle if this is prioritised, as in the "power mode" application.

It is then also possible to utilise the whole speed range which the cruise control is allowed to use, thereby also reducing fuel consumption. This is because there is greater potential for controlling the vehicle so that it reaches the low initial speed at which it should be just before, rather than long before, it begins to be accelerated by gravity. This is viewed as positive by drivers, thereby boosting acceptance of the cruise control's function and hence also increasing the use of the cruise control. This makes it possible, for example, for total fuel consumption over time to be reduced if this is prioritised.

Adaptation, i.e. determination, of the running resistance $F_{res}$ is relatively quick by the present invention. The result after even only a small number of determinations before, for example, relatively steep downgrades, is a very reliable value for the running resistance $F_{res}$.

In this specification the invention is primarily exemplified for use in a cruise control system, e.g. a look-ahead cruise control (LACC), i.e. an intelligent cruise control which can use knowledge of the nature of the road ahead to control the reference speed $v_{ref}$. The invention might however be implemented in substantially all systems which employ the running resistance $F_{res}$ in their calculations. One skilled in the art will therefore appreciate that the value determined for the running resistance $F_{res}$ is usable not only in cruise control but also in substantially all applications where $F_{res}$ is relevant.

BRIEF LIST OF DRAWINGS

Figure 2:
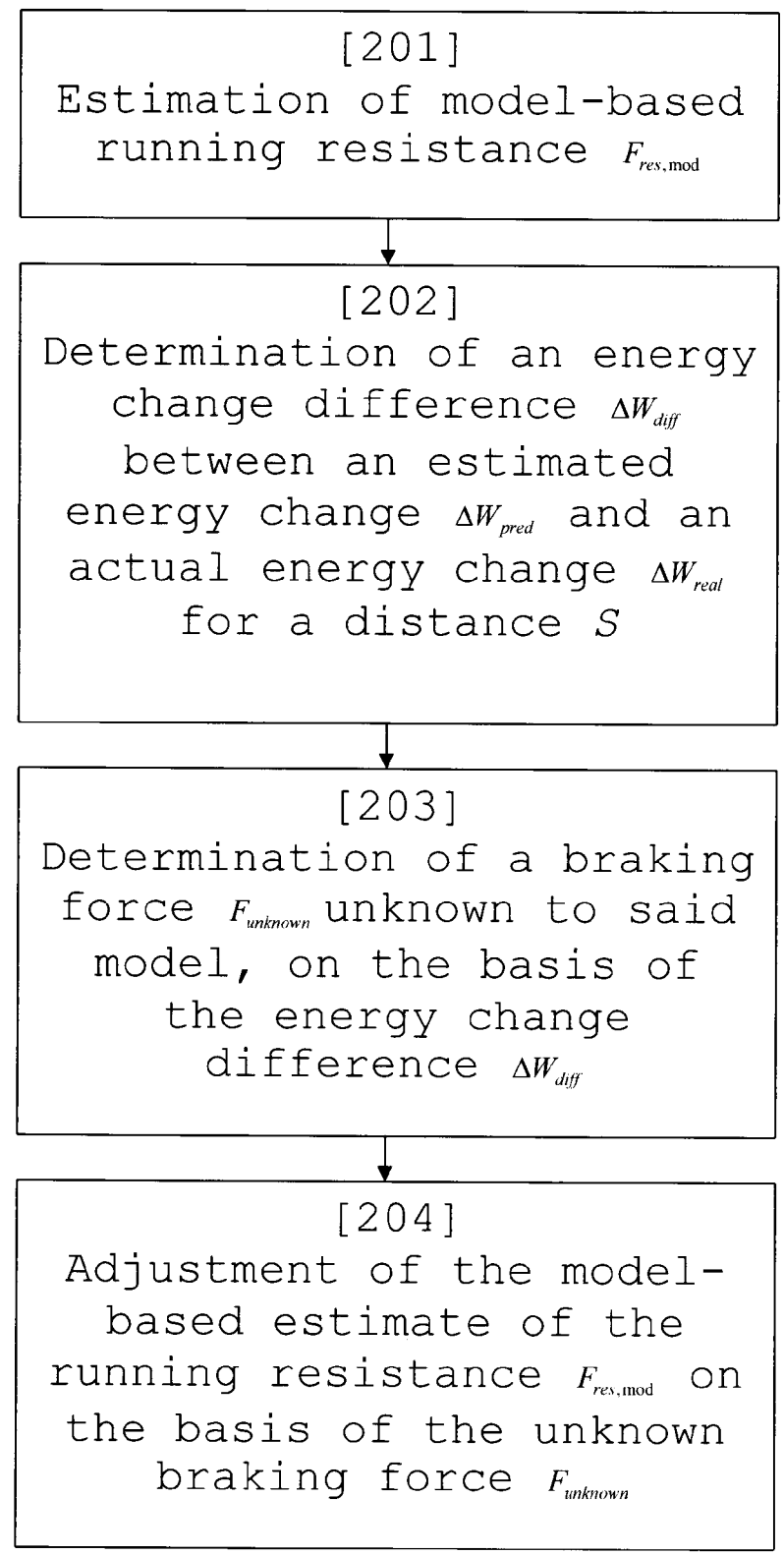
Figure 3:
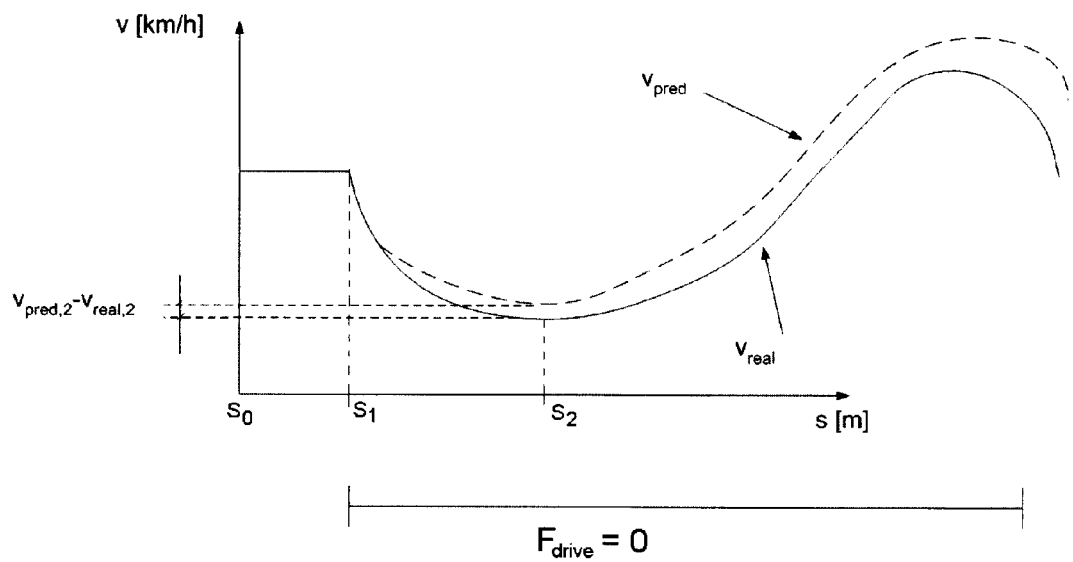
Figure 4:
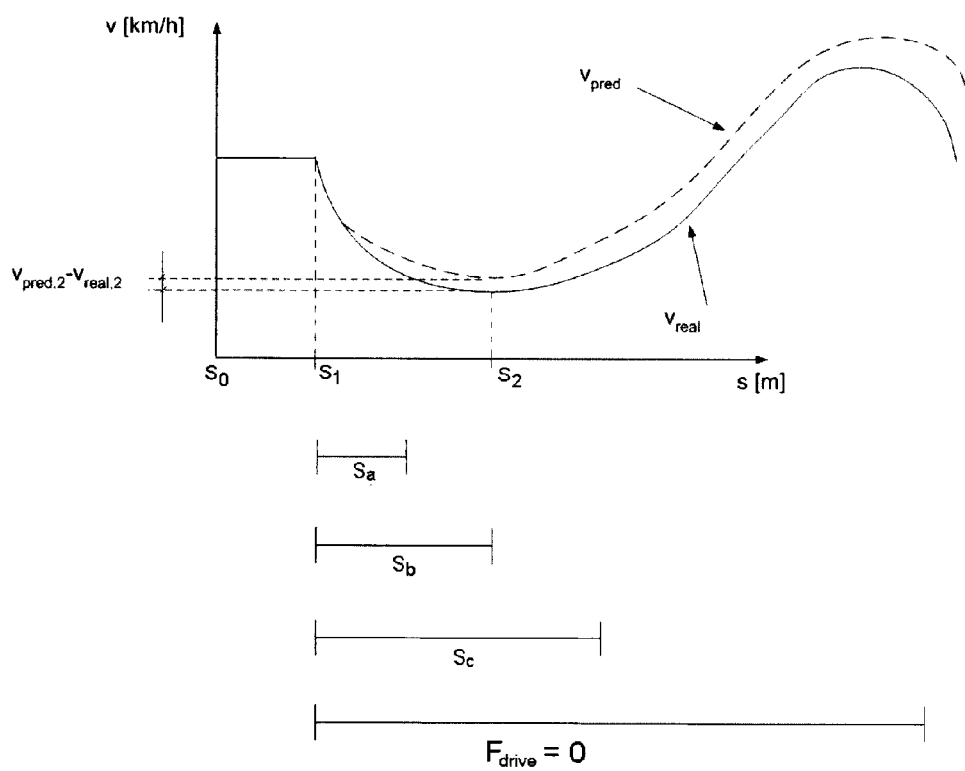
Figure 5:
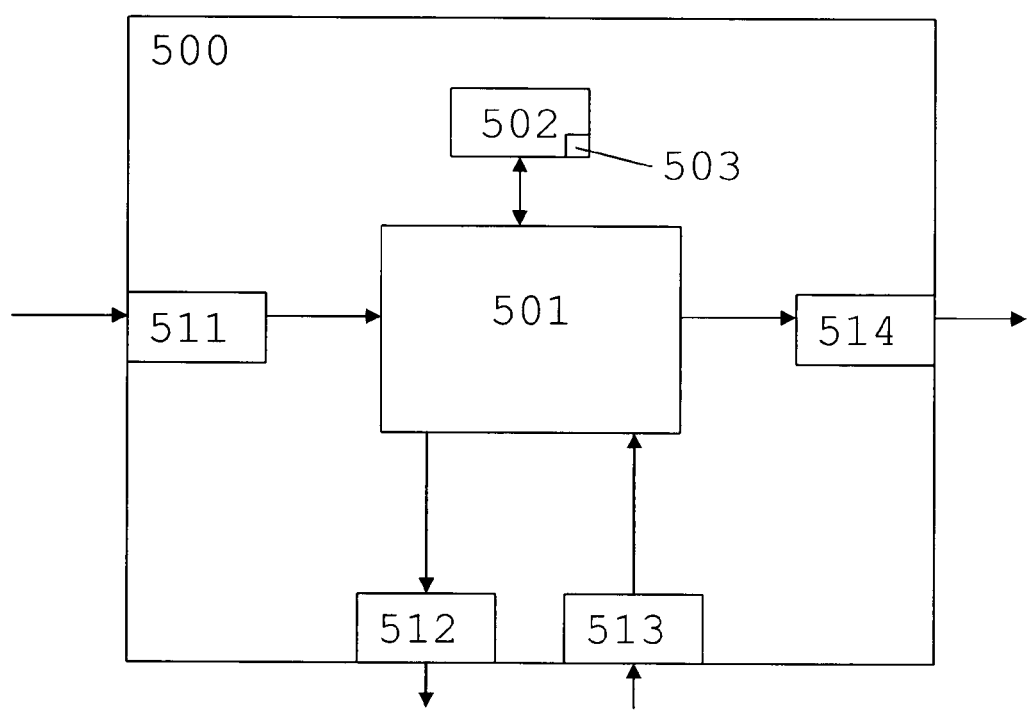

The invention is explained in more detail below with reference to the attached drawings, in which the same reference notations are used for similar items, and in which FIG. 1 depicts forces which act upon a vehicle, FIG. 2 is a flowchart for the method according to the invention, FIG. 3 depicts speed curves for a vehicle on a downgrade, FIG. 4 depicts various examples of extents for the distance S, and FIG. 5 depicts a control unit which works according to the invention.

DESCRIPTION OF PREFERRED EMBODIMENTS

The present invention results in very correct estimation of the running resistance for a vehicle. FIG. 2 is a flowchart for the method for determining the running resistance according to the invention. As a first step 201, the method according to the invention estimates a model-based running resistance $F_{res,mod}$. Using the invention makes accurate determinations of the running resistance possible even when using relatively simple models in this model-based determination of the running resistance. It is therefore possible for example for models which are simple and computationally not complex to be used for model-based determinations of, for example, the vehicle's driving force $F_{drive}$, rolling resistance $F_{roll}$ and air resistance $F_{air}$, as described in more detail below.

As a second step 202, the method according to the present invention determines an energy change difference $\Delta W_{diff}$ for the vehicle between an estimated energy change $\Delta W_{pred}$ and an actual energy change $\Delta W_{real}$.

$$\Delta W_{diff} = \Delta W_{pred} - \Delta W_{real} \qquad (eq.\ 2)$$

(One skilled in the art will appreciate that equation 2 may also be expressed as $\Delta W_{diff} = \Delta W_{real} - \Delta W_{pred}$)

This energy change difference $\Delta W_{diff}$ is determined for a distance S travelled by the vehicle, which distance has a starting point and an end point which are different. What is therefore analysed here is how well the estimated energy change $\Delta W_{pred}$ and the actual energy change $\Delta W_{real}$ correspond. As the model on which the estimated energy change $\Delta W_{pred}$ is based rarely corresponds exactly to reality, there is most commonly an energy change difference $\Delta W_{diff}$, which is therefore here determined.

As a third step 203, the method according to the invention determines a braking force $F_{unknown}$ which is unknown to the model and which acts upon the vehicle over the distance S. The estimated energy change $\Delta W_{pred}$ determined on the basis of the model takes no account of this unknown force $F_{unknown}$, since it has no knowledge of it. This force $F_{unknown}$ is therefore one of several possible reasons for a difference $\Delta W_{diff}$ between the estimated energy change $\Delta W_{pred}$ and the actual energy difference $\Delta W_{real}$. According to the invention, the energy change difference $\Delta W_{diff}$ determined can therefore be used to determine this braking force $F_{unknown}$ which is unknown to the model.

The braking force $F_{unknown}$ unknown to the model may for example be determined by dividing the energy change difference $\Delta W_{diff}$ by the respective distance S over which the vehicle loses this energy, i.e.

$$F_{unknown} = \frac{\Delta W_{diff}}{S}.$$

This determination is based on the integral equation $$\Delta W_{diff} = \int_0^S F_{unknown}\, ds$$

in which the unknown braking force $F_{unknown}$ is integrated with respect to the vehicle's location, thus arriving at the work performed by the unknown braking force $F_{unknown}$ over the distance S. The integral equation results in the simple equation $\Delta W_{diff} = F_{unknown} * S$ when all the braking forces are acting in an opposite direction to the vehicle's direction of travel, in which case the simple equation $$F_{unknown} = \frac{\Delta W_{diff}}{S}$$

produces a reliable value for the unknown braking force.

As a fourth step 204 of the present invention, the model-based estimate of the running resistance $F_{res,mod}$ is adjusted on the basis of the braking force $F_{unknown}$ which is unknown to the model. The result is a substantially correct value for the running resistance $F_{res}$. The running resistance $F_{res}$ is thus here determined by the model-based estimate of the running resistance $F_{res,mod}$ being adapted with respect to the force $F_{unknown}$ unknown to the model, making it possible to arrive at a more correct value for the running resistance $F_{res}$.

The present invention can be used to make a very good estimate of the running resistance $F_{res}$ on the basis of models which are simple, do not require particularly large amounts of memory and are computationally efficient, e.g. for the vehicle's driving force $F_{drive}$, rolling resistance $F_{roll}$ and air resistance $F_{air}$, and on the basis of the energy change difference $\Delta W_{diff}$. The models rarely correspond fully to reality. It may for example be difficult for them to predict how much wind, and from what direction, the vehicle will be affected by on a certain road segment at a certain time, how the state of the road varies over time and along the segment, or whether there is a load on the power train. Loads on the power train comprise here loading by one or more external systems, causing part of the power from the engine system to be consumed by these external systems. An example of such an external system is a cooling system for a refrigerated vehicle. The present invention makes it easy to adapt the aforesaid relatively simple models to the more complicated reality. Where/how the resistance occurs when the invention is used is also insignificant. For the present invention it therefore makes no difference whether the running resistance is for example created by the state of the road or by external systems.

The running resistance is also determined on the basis of an energy change $\Delta W_{diff}$ for the vehicle from a starting point to an end point of a distance S, resulting in a value of high quality for the energy change, since it is not a momentary value. The value for the energy change $\Delta W_{diff}$ which is used by the present invention takes instead the form of an average value for the distance S, or a filtered value of the energy change difference $\Delta W_{diff}$, which is based on a physical averaging of the forces which act upon the vehicle. According to an embodiment of the present invention, the distance S has a length L which exceeds a predetermined length of any suitable magnitude.

As mentioned above, prior art methods have based running resistance estimates on continuous measurements of the vehicle's acceleration, thus basing many calculations on acceleration signals whose magnitude varies over time because of the noisy characteristics of the acceleration signal. Thus many calculations are here based on a noisy acceleration signal, resulting in estimates of low quality. In contrast, the present invention does fewer calculations, but of higher quality, which are based on the energy change $\Delta W_{diff}$ over a distance S.

The energy change difference $\Delta W_{diff}$ arrived at according to the method comprises a kinetic energy change difference $\Delta W_{diff,k}$ and a potential energy change difference $\Delta W_{diff,p}$.

According to an embodiment of the present invention, the kinetic energy change difference $\Delta W_{diff,k}$ is a difference between a model-based estimated/predicted kinetic energy change $\Delta W_{k,pred}$ and an actual kinetic energy change $\Delta W_{k,real}$. The model-based estimated kinetic energy change $\Delta W_{k,pred}$ may here be based on a prediction of a speed of the vehicle. The actual kinetic energy change $\Delta W_{k,real}$ is based on an actual speed of the vehicle which can be measured when it is in motion, e.g. on the basis of the rotation speed of the propeller shaft, the gear ratio to the driving axle and the radius of the wheels. For vehicles equipped with an economical cruise control system as described above, vehicle speeds are predicted by the cruise control system along a horizon of any suitable length, since predicted speeds are used by the cruise control. Predicted speeds are therefore available and may be used in determining the running resistance according to this embodiment. A correct value for the running resistance is thus arrived at in a computationally efficient way.

The potential energy change difference $\Delta W_{diff,p}$ is a difference between an estimated potential energy change $\Delta W_{p,pred}$ and an actual potential energy change $\Delta W_{p,real}$ for the vehicle over the distance S. According to an embodiment of the invention, the energy change difference $\Delta W_{diff}$ is determined (according to equation 2 above) when this potential energy change difference $\Delta W_{diff,p}$ is substantially zero. This is possible if there is good knowledge of the topography, e.g. of the road gradient α over the distance S, which may be used in said determination of the energy difference $\Delta W_{diff}$. Other methods may be used for determining when the potential energy change difference $\Delta W_{diff,p}$ is substantially zero, e.g. methods based on measurement of altitude change over the distance S, which may for example involve air pressure measurements or GPS technology. When the estimated potential energy change $\Delta W_{p,pred}$ and the actual potential energy change $\Delta W_{p,real}$ correspond well in this way, if there is for example good topographical knowledge (as described above), the energy change difference $\Delta W_{diff}$ arrived at comprises substantially a kinetic energy change difference $\Delta W_{diff,k}$, thereby simplifying the calculations of the running resistance. The good knowledge of the road gradient α is thus used in this embodiment of the invention to reduce the uncertainty about and calculations relating to the potential energy when determining the running resistance.

An embodiment of the present invention makes an intelligent and advantageous choice of a suitable occasion for determining the running resistance. By suitable choice of when and/or where to determine the running resistance it is possible to minimise the uncertainty pertaining to parameters which affect the vehicle's energy balance. Intelligent choice of time and/or place for the determination also results in simpler calculations in the actual process of determining the running resistance.

According to an embodiment of the invention, the determination of the energy change difference $\Delta W_{diff}$ takes place at a time when the running resistance $F_{res}$ for the vehicle is considerably greater than the driving force $F_{drive}$ which the engine system imparts to the vehicle. At such times any influence of $F_{drive}$ may be disregarded, considerably simplifying the calculations. According to an embodiment, the determination of the running resistance takes place when the driving force $F_{drive}$ is substantially zero (0) N, in which case $F_{drive}$ may of course be disregarded. According to an embodiment, $F_{drive}$ is here regarded as substantially zero (0) N if it is less than five (5) N. As indicated above, the engine's drag losses form part of the power train's power losses $F_{drivelinelosses}$.

According to an embodiment of the invention, the determination of the energy change difference $\Delta W_{diff}$ takes place at a time when the running resistance $F_{res}$ dominates the vehicle's force equation (eq. 1). According to the invention, the running resistance $F_{res}$ is regarded as dominating the force equation when it accounts for more than half of the forces in the righthand member of the equation.

The calculations are thus further simplified.

This may be achieved by determining the energy change difference $\Delta W_{diff}$ when the vehicle effects a slight speed change, e.g. a retardation. According to an embodiment, the speed change is regarded as slight if it is not such that a gear change is required or will be effected, since for example a downward gear change affects power train losses $F_{drivelinelosses}$. According to an embodiment, the speed change is regarded as slight if the rolling resistance $F_{roll}$ and/or the air resistance $F_{air}$ are substantially constant. Determination at the time of the slight speed change, e.g. at the time of the retardation, reduces the impact of any uncertainty about the vehicle's weight m, since the running resistance $F_{res}$ is large relative to the total force $m\dot{v}$ acting upon the vehicle, thereby simplifying the calculations. According to an embodiment, the speed change is regarded as slight if any uncertainty caused by it about the weight m will not result in more than 10% of uncertainty about the running resistance $F_{res}$. In other words, determining the energy change difference $\Delta W_{diff}$ takes place when the vehicle effects such a slight speed change that the uncertainty about the running resistance $F_{res}$ will be not more than 10%.

FIG. 3 depicts schematically an example of the possible pattern of a retardation. It shows two curves, viz. a broken curve representing a predicted speed $v_{pred}$ and a continuous curve representing an actual speed $v_{pred}$, for a vehicle approaching a downgrade. Initially both $v_{pred}$ and $v_{real}$ are substantially constant over a period $S_0$-$S_1$. At $S_1$ the torque provided by the vehicle's engine system begins to ramp downwards, whereupon both $v_{pred}$ and $v_{real}$ decrease. This may for example occur just before a downgrade if the vehicle has an economical cruise control which takes account of topography ahead, e.g. a look-ahead cruise control. The cruise control here therefore demands less engine torque just before the downgrade, since it knows that the vehicle's own weight will cause it to accelerate on the downgrade.

An economical cruise control which takes account of topography ahead predicts the speed $v_{pred}$ for a road segment ahead. This prediction $v_{pred}$ is exemplified by the broken line in FIG. 3. When the cruise control predicts the speed, it may also provide this predicted speed $v_{pred}$ to the system which determines the running resistance $F_{res}$. It is of computational advantage to be able to reuse predictions already made by on-board systems when the running resistance $F_{res}$ is to be determined.

Just after the retardation has begun at $S_1$, i.e. just after the predicted speed $v_{pred}$ and actual speed $v_{real}$ have begun at $S_1$ to decrease from their initially constant values, the engine system will not contribute any driving torque. In other words, the driving force $F_{drive}$ here becomes substantially zero, $F_{drive}=0$, further simplifying the force equation (eq. 1). Using this embodiment thus results in a simplified calculation of the running resistance $F_{res}$ in that an uncertainty factor is eliminated. This embodiment of the invention thus achieves with fewer calculations a more accurate determination of the running resistance $F_{res}$.

As described above, the energy change difference $\Delta W_{diff}$ comprises a kinetic energy change difference $\Delta W_{diff,k}$ and a potential energy change difference $\Delta W_{diff,p}$, the potential energy change difference $\Delta W_{diff,p}$ in this embodiment being negligible relative to the kinetic energy change difference $\Delta W_{diff,k}$. The kinetic energy change difference $\Delta W_{diff,k}$ is a difference between a model-based estimated kinetic energy change $\Delta W_{k,pred}$ and an actual kinetic energy change $\Delta W_{k,real}$, the model-based estimated change being based on the predicted speed $v_{pred}$ (broken line in FIG. 3) and the actual change being based on the actual speed $v_{real}$ (continuous line in FIG. 3). As depicted in FIG. 3, $v_{pred}$ and $v_{real}$ differ, so there is an energy change difference $\Delta W_{diff}$. As this difference takes the form of the kinetic energy change difference $\Delta W_{diff,k}$ it may be found, as described in more detail below, that the deviation between the predicted speed $v_{pred}$ and the actual speed $v_{real}$ depends substantially entirely on the running resistance $F_{res}$, i.e. on the rolling resistance $F_{roll}$, the air resistance $F_{air}$ and power train losses $F_{drivelinelosses}$.

As illustrated in FIG. 3, the predicted speed $v_{pred}$ and the actual speed $v_{real}$ reach at $S_2$ their respective minima $v_{pred,min}$ and $v_{real,min}$ which differ in magnitude, before rising again after $S_2$. The vehicle therefore first retards before the downgrade $S_1$-$S_2$ when the cruise control decreases the demand for engine torque, followed by accelerating downhill after $S_2$.

According to an embodiment of the invention, the determination of the energy change difference $\Delta W_{diff}$ takes place at a time when the road section covered by the distance S over which the energy change difference is analysed is substantially level at least in places, i.e. when it comprises one or more substantially level portions. When the road is level, i.e. road gradient zero, $\alpha=0$, the term for gravity in the force equation (eq. 1) is also zero, mg sin $\alpha=0$. The influence of the vehicle's weight m on the determination of the running resistance $F_{res}$ is thus also reduced. This is highly advantageous, since there is rarely good knowledge of the vehicle's weight m. The weight of for example a truck may vary greatly depending on whether it is laden or not, and also on the nature of its cargo.

An occasion when the road gradient $\alpha$ is generally slight is just before a downgrade. Moreover it is by definition zero at the approach to the downgrade. This embodiment of the invention may therefore be employed with advantage at the approaches to downgrades.

According to an embodiment of the invention, the road gradient $\alpha$ is regarded as slight if it is less than or equal to one percent, i.e. $1\% \leq \alpha \leq 1\%$. A stretch of road is regarded as substantially level if its gradient $\alpha$ is slight.

As mentioned above, vehicles with certain economical cruise controls usually also effect a retardation just before a downgrade. At the approach to a downgrade, the force equation (eq. 1) may therefore be considerably simplified in that both the driving force $F_{drive}$ and the force of gravity in the equation are zero, $F_{drive}=0$ and mg sin $\alpha=0$. This is therefore a suitable occasion for determining the running resistance $F_{res}$ according to the present invention, since any uncertainty about said vehicle's weight m and the driving force $F_{drive}$ will have little influence. In other words, according to an embodiment the distance S may with advantage be relocated to a road segment after $S_2$ where the vehicle is retarded with substantially no driving engine torque and the gradient $\alpha$ is slight.

Over such a distance S, the air resistance $F_{air}$ and the rolling resistance $F_{roll}$ which form part of the running resistance $F_{res}$ have a dominant effect on the vehicle's speed, considerably simplifying the calculations.

According to an embodiment of the present invention, the distance S chosen is such that it comprises the point $S_2$ at which the vehicle has a local speed minimum. Thus the distance S should here comprise minima for the respective predicted and actual speeds $v_{pred,min}$ and $v_{real,min}$ in FIG. 3.

According to an embodiment, this local speed minimum marks the end point of the distance S. This embodiment affords the advantage that local speed minima for which values already determined are available on board, since they are used by other systems, e.g. cruise control systems. This means that the distance S may here begin just before a downgrade, when the retardation has commenced and the driving force $F_{drive}$ is substantially zero N, and end at a speed minimum.

FIG. 4 depicts various examples $S_a$, $S_b$, $S_c$ of extents for the distance S, which extents may be used according to various embodiments of the invention. For the extent $S_a$ the distance S has its starting point just after the predicted speed $v_{pred}$ and actual speed $v_{real}$ have begun to drop at $S_1$, and its end point before $S_2$, where the respective predicted and actual speeds $v_{pred,min}$ and $v_{real,min}$ have their minima.

For the extent $S_b$ the distance S has its starting point just after the predicted speed $v_{pred}$ and the actual speed $v_{real}$ have begun to drop at $S_1$, and its end point at $S_2$, i.e. at the respective minima of the predicted speed $v_{pred,min}$ and the actual speed $v_{real,min}$. The values for the minima of $v_{pred,min}$ and $v_{real,min}$ are available through having already been determined by the cruise control, resulting in a computationally very efficient way of determining the running resistance.

According to an embodiment of the present invention, the distance S is set as long as possible, subject to being able to make a reliable determination of the running resistance $F_{res}$ during it. This is illustrated by the extent $S_c$ in FIG. 4.

Reliable determination of the running resistance $F_{res}$ is not possible if a gear change takes place, e.g. during retardation, or if a retardation is discontinued, e.g. by a driver or a cruise control. Nor will determination of the running resistance $F_{res}$ be reliable if the predicted speed $v_{pred}$ and the actual speed $v_{real}$ differ considerably, which may for example indicate that the wind direction has changed. The extent chosen for the distance S according to this embodiment is therefore long enough to allow good physical averaging of the forces which act upon the vehicle, but short enough to avoid events which would render the estimation of the running resistance $F_{res}$ unreliable. According to an embodiment, the predicted speed $v_{pred}$ and the actual speed $v_{real}$ are regarded as differing considerably if the deviation is more than 4 km/h.

The distance S chosen is therefore such that its end point is relatively near, but does not comprise the aforesaid events which would render the determination unreliable. In practice this is achieved by values being monitored until one of the aforesaid events occurs and by only values before it being then employed in the determination. In this way the distance S chosen will be as long as possible.

In the case of the extent $S_1$ for the distance S in FIG. 4, an event which renders estimating the running resistance $F_{res}$ unreliable occurs just before the respective minima of the predicted speed $v_{pred,min}$ and the actual speed $v_{real,min}$, so the extent $S_1$ is relatively short.

Choosing suitable lengths for the distance S according to the foregoing embodiments results in maximum possible reliability of estimation of the running resistance $F_{res}$ while at the same time minimising the calculations.

According to an embodiment of the invention, the adaptation of the running resistance $F_{res}$ is limited/saturated at a predetermined magnitude Y N. This is to prevent for example any error in the weight estimation being incorrectly interpreted as an error in the running resistance estimation. If the weight is estimated incorrectly, the adaptation of the running resistance will also be incorrect. As the adaptation of the running resistance $F_{res}$ according to this embodiment is limited to a predetermined magnitude Y N, the influence of the incorrectly estimated weight is minimised. Y has here any suitable value.

According to an embodiment of the invention, the adaptation begins again if the vehicle changes roads. Road changes may for example be identified on the basis of road-related GPS information, e.g. on the basis of road number in the case of a road on which a vehicle is located by means of the GPS system. Here the adaptation is therefore zeroed when the vehicle changes road. This means that separate values for the running resistance are arrived at for different roads, which is advantageous in that different roads often have different characteristics. They may for example differ in asphalt quality and/or extent (which may for example affect the vehicle's wind resistance). Thus according to this embodiment a first value for the running resistance would be obtained for a first road with asphalt which is easy to roll on and the vehicle has a tailwind, and a second value for a second road then joined by the vehicle on which the asphalt is hard to roll on and the vehicle has a headwind. It is advantageous to obtain separate and correct values for each road.

According to an embodiment of the present invention, an adjustment parameter $k_{adj}$ is determined on the basis of the braking force $F_{unknown}$ which is unknown to the model. This adjustment parameter $k_{adj}$ is used when determining the running resistance $F_{res}$. It may be regarded as an addition to the running resistance which arises from this force $F_{unknown}$ unknown to the model. According to an embodiment, the adjustment parameter $k_{adj}$ is constant over a period of time or for a distance, e.g. along a road. According to an embodiment, it corresponds to the braking force $F_{unknown}$ unknown to the model, i.e. $k_{adj} = F_{unknown}$.

In more detail, the adjustment parameter $k_{adj}$ may be used to adjust the model-based estimated running resistance $F_{res,mod}$. According to an embodiment, it is used as an additive parameter to the other terms of the force equation, i.e. $F_{res,mod} = F_{res} + k_{adj}$. The force equation (eq. 1) then assumes the form $$m\dot{v} = F_{drive} - F_{res} - k_{adj} - mg \sin \alpha \quad \text{(eq. 3)}$$

According to another embodiment, the adjustment parameter $k_{adj}$ is used as a multiplicative parameter which is multiplied by terms for running resistance $F_{res}$ in the force equation, i.e. $f_{res,mod} = F_{res} * k_{adj}$. It corresponds here to a dimensionless scaling constant $k_{scale}$, which has a value based on a ratio between an actual value of the running resistance $F_{res,real}$ and the model-based estimate of the running resistance $F_{res,mod}$, i.e.

$$k_{adj} = k_{scale} = \frac{F_{res,real}}{F_{res,mod}}.$$

The force equation (eq. 1) then assumes the form $$m\dot{v} = F_{drive} - k_{adj} * F_{res} - mg \sin \alpha \quad \text{(eq. 4)}$$

Using the adjustment parameter $k_{adj}$ makes a computationally efficient adjustment of simple models possible so that they become very close to reality.

The present invention relates also to a system for determining a running resistance $F_{res}$ for a vehicle. The system comprises an estimation unit, a difference unit, a force unit and an adjustment unit. The estimation unit is adapted to estimating a model-based running resistance $F_{res,mod}$ as described above in relation to the method. The difference unit is adapted to determining the energy change difference $\Delta W_{diff}$ described above between a model-based estimated energy change $\Delta W_{pred}$ and an actual energy change $\Delta W_{real}$, for the vehicle from a starting point to an end point of a distance S which is travelled by the vehicle.

The force unit is adapted to determining, as described above, on the basis of the energy change difference $\Delta W_{diff}$ a braking force $F_{unknown}$ which is unknown to the model and which acts upon the vehicle over the distance S. The adjustment unit is adapted to determining the running resistance $F_{res}$ to an adjusted value of the estimate of the model-based running resistance $F_{res,mod}$. As described above, the adjustment is based here on the force $F_{unknown}$ which is unknown to the model.

One skilled in the art will appreciate that a method for determining the running resistance $F_{res}$ according to the present invention may also be implemented in a computer program which, when executed in a computer, causes the computer to apply the method. The computer program usually takes the form of a computer program product 503 (in FIG. 5) stored on a non-transitory computer-readable medium which contains the computer program. Said computer-readable medium comprises a suitable memory, e.g. ROM (read-only memory), PROM (programmable read-only memory), EPROM (erasable PROM), flash memory, EEPROM (electrically erasable PROM), a hard disc unit, etc.

FIG. 5 depicts schematically a control unit 500 comprising a calculation unit 501 which may take the form of substantially any suitable type of processor or microcomputer, e.g. a circuit for digital signal processing (digital signal processor, DSP), or a circuit with a predetermined specific function (application specific integrated circuit, ASIC). The calculation unit 501 is connected to a memory unit 502 which is situated in the control unit 500 and which provides the calculation unit with, for example, the stored programme code and/or stored data which the calculation unit needs to enable it to do calculations. The calculation unit 501 is also adapted to storing partial or final results of calculations in the memory unit 502.

The control unit 500 is further provided with respective devices 511, 512, 513, 514 for receiving and sending input and output signals. These input and output signals may comprise waveforms, pulses or other attributes which the input signal receiving devices 511, 513 can detect as information and which can be converted to signals which the calculation unit 501 can process. These signals are then supplied to the calculation unit. The output signal sending devices 512, 514 are arranged to convert signals received from the calculation unit in order, e.g. by modulating them, to create output signals which can be conveyed to other systems on board the vehicle.

Each of the connections to the respective devices for receiving and sending input and output signals may take the form of one or more from among a cable, a data bus, e.g. a CAN (controller area network) bus, an MOST (media oriented systems transport) bus or some other bus configuration, or a wireless connection.

One skilled in the art will appreciate that the aforesaid computer may take the form of the calculation unit 501 and that the aforesaid memory may take the form of the memory unit 502.

One skilled in the art will also appreciate that the above system may be modified according to the various embodiments of the method according to the invention. The invention relates also to a motor vehicle, e.g. a truck or bus, provided with at least one system for determining the running resistance $F_{res}$ according to the invention.

The present invention is not restricted to the invention's embodiments described above but relates to and comprises all embodiments within the protective scope of the attached independent claims.

The invention claimed is:

1. A method for controlling at least one of a gearbox of a vehicle and a cruise control system of the vehicle by determining a running resistance $F_{res}$ for the vehicle, the method comprising:
providing an estimated running resistance estimated according to a calculation based on a model;
receiving, by an automated processor, an actual vehicle speed parameter for a first distance travelled by the vehicle, the first distance measured from a starting point to an end point;
calculating an actual energy change for the vehicle based on the received actual vehicle speed parameter;
determining, by the automated processor, an energy change difference $\Delta W_{diff}$ between an estimated energy change according to the calculation based on the model and the actual energy change for said vehicle;
based on said energy change difference $\Delta W_{diff}$, determining a first braking force which is unknown to the model and which acts upon said vehicle over said first distance;
determining said running resistance $F_{res}$ to an adjusted value of said estimated running resistance, said adjusted value is based on said first braking force; and controlling at least one of the gearbox and the cruise control according to the running resistance $F_{res}$.

2. A method according to claim 1, wherein said energy change difference $\Delta W_{diff}$ comprises a kinetic energy change difference $\Delta W_{diff,k}$ between an estimated kinetic energy change $\Delta W_{k,pred}$ estimated according to the model and an actual kinetic energy change $\Delta W_{k,real}$.

3. A method according to claim 2, further comprising:
basing said estimated kinetic energy change $\Delta W_{k,pred}$ on a prediction of a speed for said vehicle; and
basing said actual kinetic energy change $\Delta W_{k,real}$ on an actual speed of said vehicle.

4. A method according to claim 2, wherein said determination of said energy change difference $\Delta W_{diff}$ takes place when a potential energy change difference $\Delta W_{diff,p}$ between an estimated potential energy change $\Delta W_{p,pred}$ and an actual potential energy change $\Delta W_{p,real}$ for said vehicle over said first distance is substantially zero.

5. A method according to claim 2, wherein said determination of said energy change difference $\Delta W_{diff}$ takes place when said running resistance $F_{res}$ for said vehicle is greater than a driving force $F_{drive}$ which acts upon said vehicle.

6. A method according to claim 5, wherein said determination takes place when said driving force $F_{drive}$ is substantially zero (0) N.

7. A method according to claim 2, wherein said determination of said energy change difference $\Delta W_{diff}$ takes place when said running resistance $F_{res}$ for said vehicle dominates a force equation for said vehicle.

8. A method according to claim 2, wherein said determination of said energy change difference $\Delta W_{diff}$ takes place when said vehicle effects a speed change in which an impact of any uncertainty about a weight m of said vehicle is slight.

9. A method according to claim 2, wherein said determination of said energy change difference $\Delta W_{diff}$ takes place when a section of road covered by said first distance is substantially level at least in places along said first distance, such that the impact of any uncertainty about a weight m of said vehicle is slight.

10. A method according to claim 1, wherein said first distance comprises a point where a speed of said vehicle has a local minimum.

11. A method according to claim 8, wherein a driving force $F_{drive}$ for said vehicle at said starting point is substantially zero N.

12. A method according to claim 1, wherein a road gradient α over said first distance is used in said determination of said energy difference $\Delta W_{diff}$.

13. A method according to claim 1, wherein said first distance has a length that exceeds a predetermined length, and said energy change difference $\Delta W_{diff}$ takes the form of an average value over said first distance.

14. A method according to claim 1, wherein said end point is before a point where any of the following occurs:
gear change;
discontinuation of a retardation on the basis of input by a user;
discontinuation of a retardation on the basis of intervention by a cruise control; or
detection of a considerable difference between a predicted speed $v_{pred}$ and the actual speed parameter of the vehicle.

15. A method according to claim 1, further comprising:
determining an adjustment parameter based on said first braking force
wherein said determining of the running resistance $F_{res}$ is based on the adjustment parameter.

16. A method according to claim 15, wherein said adjustment parameter is used for said estimated running resistance, wherein said adjustment parameter is either
an additive parameter; or
a multiplicative parameter.

17. A non-transitory processor-readable medium product incorporating computer program code, which when said program code is executed in a processor, causes said processor to apply said method according to claim 1.

18. A system configured for controlling at least one of a gearbox of a vehicle and a cruise control system of the vehicle by determining a running resistance $F_{res}$ for a vehicle, said system comprising:
a model parameter unit configured to provide an estimated resistance estimated according to a calculation based on a model;
a vehicle data processing module comprising an automated processor and configured to receive an actual vehicle speed parameter for a first distance travelled by the vehicle, the first distance measured from a starting point to an end point;
the vehicle data processing module configured to calculate an actual energy change for the vehicle based on the received actual vehicle speed parameter;
a difference unit configured for determining an energy change difference $\Delta W_{diff}$ between an estimated energy change according to the calculation based on the model and the actual energy change for said vehicle;
a force unit configured for determining, based on said energy change difference $\Delta W_{diff}$, a first braking force which is unknown to the model and which acts upon said vehicle over said first distance; and an adjustment unit configured for determining said running resistance $F_{res}$ to an adjusted value of said estimated running resistance, and basing said adjustment on said first braking force; and controlling at least one of the gearbox and the cruise control according to the running resistance $F_{res}$.

19. A vehicle comprising a system configured for determining the running resistance $F_{res}$ according to claim 18.

* * * * *